(12) United States Patent
Smith

(10) Patent No.: US 6,835,505 B2
(45) Date of Patent: Dec. 28, 2004

(54) MASK FOR PROJECTION PHOTOLITHOGRAPHY AT OR BELOW ABOUT 160 NM AND A METHOD THEREOF

(75) Inventor: Bruce W. Smith, Webster, NY (US)

(73) Assignee: Rochester Institute of Technology, Rochester, NY (US)

(*) Notice: Subject to any disclaimer, the term of this patent is extended or adjusted under 35 U.S.C. 154(b) by 215 days.

(21) Appl. No.: 10/156,226

(22) Filed: May 24, 2002

(65) Prior Publication Data

US 2003/0077520 A1 Apr. 24, 2003

Related U.S. Application Data

(63) Continuation-in-part of application No. 09/415,149, filed on Oct. 8, 1999, now Pat. No. 6,395,433.
(60) Provisional application No. 60/103,542, filed on Oct. 8, 1998, and provisional application No. 60/124,954, filed on Mar. 18, 1999.

(51) Int. Cl.[7] .............................................. G03F 9/00
(52) U.S. Cl. ....................................................... 430/5
(58) Field of Search ............................... 430/5; 378/34, 378/35

(56) References Cited

U.S. PATENT DOCUMENTS

| | | | |
|---|---|---|---|
| 4,890,309 A | 12/1989 | Smith et al. |
| 5,582,939 A | 12/1996 | Pierrat |
| 5,795,684 A | 8/1998 | Troccolo |
| 5,811,208 A | 9/1998 | Yokoyama et al. |
| 5,897,977 A | 4/1999 | Carcia et al. |
| 5,935,733 A | 8/1999 | Scott et al. |
| 5,935,735 A | 8/1999 | Okubo et al. |
| 5,939,227 A | 8/1999 | Smith |
| 6,274,280 B1 | 8/2001 | Carcia et al. |
| 6,309,780 B1 | 10/2001 | Smith |
| 6,395,433 B1 | 5/2002 | Smith |

Primary Examiner—Mark F. Huff
Assistant Examiner—Saleha Mohamedulla
(74) Attorney, Agent, or Firm—Nixon Peabody LLP

(57) ABSTRACT

An attenuated phase shift mask for use in a lithography process includes a masking film made of at least one material with at least a silicon component which provides a transmission above about 0.5 percent and a phase shift of about a 180° for radiation at a wavelength at or below about 160 nm.

67 Claims, 12 Drawing Sheets

MASK FOR PROJECTION PHOTOLITHOGRAPHY AT OR BELOW ABOUT 160 NM AND A METHOD THEREOF

This application is a continuation-in-part of U.S. patent application Ser. No. 09/415,149 filed on Oct. 8, 1999 now U.S. Pat. 6,395,433 which claims the benefit of U.S. Provisional Patent Application Ser. No. 60/103,542 filed on Oct. 8, 1998 and of U.S. Provisional Patent Application Ser. No. 60/124,954 filed on Mar. 18, 1999 which are all herein incorporated by reference.

FIELD OF THE INVENTION

This invention relates generally to lithography and, more particularly, to a mask for projection photolithography at or below about 160 nm and a lithography method using that mask.

BACKGROUND OF THE INVENTION

Optical lithography has been one of the principal driving forces behind the continual improvements in the size and performance of the integrated circuit (IC). Feature resolution down to and below 0.10 $\mu$m is now possible using the 193 nm ArF excimer laser wavelength and optical projection tools operating at numerical apertures above 0.65. The industry is now at a point though where resolution is limited for current optical lithographic technologies. In order to extend capabilities for the next millennium toward sub-0.10 $\mu$m, modifications in source wavelength (toward shorter wavelength), optics (toward higher NA and lower aberration), illumination (toward customized illumination), masking, and process technology are required and are getting a tremendous amount of attention.

With respect to masking, control of the phase information at a mask may allow for manipulation of imaging performance to achieve smaller feature resolution. Phase shift masking (PSM) employs constructive and destructive interference to improve both resolution and focal depth for a variety of feature types. For dense features, a transparent phase shifter added to or subtracted from alternating mask openings allows for a doubling in resolution by decreasing the mask and wafer electric field frequency. A lens acting on this diffracted mask information has a 50% decrease in the numerical aperture requirements. Phase shift masking using such an alternating shifter approach can also result in reduced sensitivity to defocus and other aberrations, but is limited to dense grating type mask features. Variations in the alternating phase shift mask have been developed to allow for application to non-repetitive structures. Depending on the mask fabrication technique, process control may limit the manufacturability of these types of phase shift masks for short UV wavelength exposures. Each of these prior phase-shift masking approaches also requires some level of added mask and process complexity and none of these techniques can be used universally for all feature sizes and shapes. Accordingly, an approach which can minimize mask design and fabrication complexity may gain the greatest acceptance for application to manufacturing.

An attenuated phase shift mask (APSM) may be such an approach. Using this approach, conventional opaque areas on a binary mask are replaced with partially transmitting regions (up to 100%) that produce a $\pi$ phase shift with respect to clear regions as disclosed in U.S. Pat. No. 4,890,309 to Smith et al. which is herein incorporated by reference.

In an ASPM, as light travels through a transparent material, a phase shift occurs based on the refractive index $n_i(l)$ and thickness t of the medium. By design, APSM films are not transparent but possess a transmissive characteristic based on the material's extinction coefficient k(l). As k(l) increases, an abrupt phase shift also occurs at the air-film interface. As these materials are considered, it is the complex refractive index n*=n+ik that is of interest. The phase shifting effect as light travels through a semitransparent material can be expressed as:

$$\phi = (2\pi/\lambda)[n_i(\lambda)-1]t + arg[2n^*_2/(n^*_1+n^*_2)]$$

where $n^*_1$ and $n^*_2$ are complex refractive indices of the first and second medium respectively. This equation assumes that the phase contribution from the APSM film-substrate interface is negligible, which is a reasonable approximation. A third term to the equation above could be included to account for this phase change if desired. The transmission properties of an APSM film are determined as:

$$T = exp(-4\pi kt/\lambda).$$

Preferably, the APSM should provide transmission above about 0.5 percent for wavelengths at or below about 160 nm and also provide about a 180° phase shift.

There are several requirements for an APSM material in order for it to be considered production worthy. Materials must exhibit suitable optical transmission and phase shifting properties and allow for pattern delineation (etching), radiation stability, and durability. Additionally, there may be optical requirements of the material at longer wavelengths, since any mask must be compatible with inspection and alignment operations.

The APSM film should also possess adequate etch characteristics and selectivity to both the resist and the substrate. Conventional wet etching is not anisotropic and limitations are being realized for current mask applications. Plasma-reactive ion etch (RIE) is a requirement for these next generation masking materials, which presents both chemical and physical challenges to pattern transfer. Without sufficient selectivity to the mask substrate, etching of the mask substrate will contribute to phase shifting effects and thus will need to be accounted for. As exposure wavelengths are pushed below 160 nm, etch control becomes increasingly critical. Without adequate etch selectivity, a transparent etch stop layer is required between the APSM film and the substrate.

Work in areas of attenuated phase-shift masking has demonstrated both resolution and focal depth improvement for a variety of feature types. However, prior to the present invention, practical materials for use in an APSM for IC mask fabrication which can satisfy the 180° phase-shift and the required transmittance, at targeted wavelengths below about 160 nm, such as 157 nm, 148 nm or 126 nm, within a given film thickness, and which satisfy the other requirements noted above have not been explored or found.

Optical lithography below 160 nm has recently been identified as a likely candidate for use for sub-100 nm device geometry. Although alternative lithographic strategies are being considered, a path which utilizes more conventional optical approaches may be more attractive and more easily implemented if feasible. The 157 nm VUV wavelength is not a tremendous departure from 193 nm and will not likely relax the requirements on imaging tools or process. It may, however, allow optical lithography to be utilized for one or more technology nodes, especially given the success the industry has experienced with pushing 248 nm and 193 nm. However, materials issues become more challenging at shorter wavelengths. Thin films that are sufficient for use at wavelengths near or above 200 nm are more likely than not to be problematic at 157 nm. Masking materials, both binary or phase shifting, need to be closely explored.

SUMMARY OF THE INVENTION

A mask for use in a lithography process in accordance with one embodiment of the present invention includes a masking film made of at least one material with at least a silicon component which provides a transmission above about 0.5 percent and a phase shift of about a 180° for radiation at a wavelength at or below about 160 nm.

An attenuated phase shift mask in accordance with another embodiment of the present invention includes a substrate with at least one surface and a masking film made of at least one material with at least a silicon component. The masking film is located on at least a portion of the one surface of the substrate and provides a transmission above about 0.5 percent and a phase shift of about a 180° for radiation at a wavelength at or below about 160 nm.

A method for lithography in accordance with another embodiment of the present invention includes a few steps. First, a masking film made of at least one material with at least a silicon component is placed over at least a portion of the one surface of a substrate. Next, the masking film and the substrate are exposed to radiation at a wavelength at or below about 160 nm. The masking film provides a transmission above about 0.5 percent and a phase shift of about a 180° for radiation at a wavelength at or below about 160 nm.

Another attenuated phase shift mask for use in a lithography process in accordance with another embodiment of the present invention includes a mask comprising at least silicon which provides a transmission below about 0.5 percent for radiation at a wavelength at or below about 160 nm.

Another mask in accordance with another embodiment of the present invention includes a substrate with at least one surface and a masking film on at least a portion of the one surface of the substrate. The masking film is made of at least silicon and provides a transmission below about 0.5 percent for radiation at a wavelength at or below about 160 nm.

Another method for lithography in accordance with another embodiment of the present invention also includes a few steps. First, a masking film made of at least silicon is placed over at least a portion of one surface of a substrate. Next, the masking film is exposed to radiation at a wavelength at or below about 160 nm. The masking film provides a transmission below about 0.5 percent for radiation at a wavelength at or below about 160 nm.

The present invention provides a number of advantages including providing a mask which has desirable optical properties for use in optical lithography at or below about 160 nm. More specifically, the masking film is made of at least one material with a silicon component and is capable of producing a phase shift of 180° with transmission at a targeted wavelength at or below about 160 nm (such as 157 nm, 148 nm, or 126 nm) above about 0.5 percent and up to 100 percent. The material or materials used in the masking film (that is the thin film which controls the phase shifting and transmission of sub-160 nm radiation) are based on the unique extinction coefficient properties of silicon and/or silicon dielectrics (including silicon dioxide, $SiO_2$, and silicon nitride, $Si_3N_4$) below 160 nm. Preferably, the substrate is essentially transparent. The low extinction coefficient value of silicon dioxide at or below 160 nm allows it to be incorporated as a hosting material, which can allow transmission of the mask to values as high as 100%. The higher extinction coefficient values of metals, oxides, and nitrides of the families of tantalum, titanium, zirconium, molybdenum, tungsten, niobium, aluminum, chromium, group IV, V, and VI transitional metals, and silicon nitride allow them to be also incorporated to control the transmission of the mask to values below 100%. The relatively low extinction coefficient value of silicon below 160 nm as compared to higher wavelengths allows it to be incorporated at a significant level in the masking film to permit tailoring of the optical properties of the mask which is not possible at longer lithographic wavelengths. Additionally, the higher extinction coefficient of silicon for wavelengths above 160 nm (from a value near 1.6 to a value near 3.0 at 300 nm), allows for the control of longer wavelength transmission in the mask to be sufficiently low to allow for mask inspection and mask alignment.

Another advantage of the present invention is that the desired short and long wavelength transmission properties of the mask as well as its thermomechanical and exposing radiation stability properties can be customized through the use of additional materials in the masking film. More specifically, absorbing metal oxides, such as oxides of Ta, Mo, Ti, Fe, Ru, Mn, Cu, Cr, Ni, V, Nb, Hf, Sn, In, Co, Si, Al, Zr, and group IV, V, and VI transitional metals can be combined with the silicon dielectric to decrease transmission properties of the APSM film below 160 nm and at longer wavelengths. Similarly, absorbing metal nitrides, such as nitrides of Ta, Mo, Ti, Fe, Ru, Mn, Cu, Cr, Ni, V, Nb, Hf, Sn, In, Si, Co, Al, Zr, and group IV, V, and VI transitional metals can also be combined with the silicon dielectic to decrease transmission properties of the APSM film below 160 nm and at longer wavelengths.

The present invention also provides suitable selectivity, preferably about 2:1 or better, between the mask and the underlying substrate as the result of the combination of a material with a silicon component in the mask and material with a fluoride component in the substrate. Materials with silicon are volatile in fluorine chemistry, whereas materials with fluorine are stable in the same chemistry. As a result, with the present invention the mask can be etched without a significant loss of the underlying substrate or resist material. Alternatively, a fused silica substrate ($SiO_2$) can be used without a fluoride film when selectivity is less than 2:1 with the masking film, but etch control is achieved through careful process control, i.e. etch through the masking film 12 then stop at the surface of the substrate 14.

Yet another advantage of the present invention is that reflectivity at the masking film/air interface may be reduced through use of an optical interference coating, such as a silicon-based dielectric film (such as silicon nitride or silicon dioxide) with thickness adjusted to result in absorption and quarter wave interference at the targeted wavelength at or below 160 nm.

Yet another advantage of the present invention is that the mask can be modified for use in applications where the transmission is below about 0.5% and phase shifting is not required. In this particular embodiment, the mask is a binary mask and the masking film thickness is adjusted to control transmission properties at the targeted wavelength below 160 nm.

The present invention is an attenuating optical photolithography phase shifting mask for use at wavelengths at or below 160 nm which makes use of the unique optical properties of semiconductor, metal, and dielectric materials at these wavelengths. These materials are the semiconductors, metals, oxides, and nitrides of the families of tantalum, titanium, zirconium, molybdenum, tungsten, niobium, aluminum, chromium, silicon, and group IV, V, and VI transitional metals. The materials of the present invention may comprise a stacked layer structure or a single layer and provide desirable dry etch selectivity, adhesion properties, and chemical durability.

DETAILED DESCRIPTION

Figure 1A:
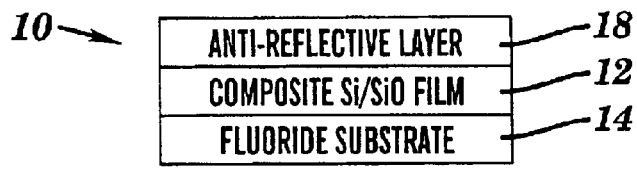
FIG. 1A is a cross-sectional diagram of a 157 nm attenuated phase shift mask in accordance with one embodiment of the present invention.

Some examples of attenuated phase shift masks 10 for use in lithography at or below 160 nm in accordance with different embodiments of the present invention are illustrated in FIGS. 1A–1E. Each of these masks 10 comprises a masking film 12 made of at least one material with at least a silicon component which provides for a transmission above about 0.5 percent and a phase shift of about a 180° for radiation at a wavelength at or below about 160 nm and the underlying substrate 14. The present invention provides a number of advantages including providing a mask 10 which has suitable optical properties for lithography at or below about 160 nm, has optical properties which can be easily modified, and has suitable etch characteristics between the mask 10 and the underlying substrate 14.

Referring to FIGS. 1A–1E, the masking film 12 is made of at least one material which has a silicon component and is capable of producing a phase shift of about 180° with a transmission above about 0.5 percent and up to 100 percent at a targeted wavelength at or below about 160 nm (such as 157 nm, 148 nm, or 126 nm) in these particular embodiments. The particular material or materials with a silicon component used in the mask 10 (that is the thin film which controls the phase shifting and transmission of sub-160 nm radiation) are based on the refractive index of and the unique extinction coefficient properties of silicon and/or silicon dielectrics (including silicon dioxide, $SiO_2$, and silicon nitride, $Si_3N_4$) below 160 nm. The low extinction coefficient value of silicon dioxide at or below 160 nm allows it to be incorporated as a hosting material, which can allow transmission of the mask to values as high as 100%. The higher extinction coefficient values of metals, oxides, and nitrides of the families of tantalum, titanium, zirconium, molybdenum, tungsten, niobium, aluminum, chromium, group IV, V, and VI transitional metals, and silicon nitride allow them to be also incorporated to control the transmission of the mask to values below 100%. The low extinction coefficient value of silicon below 160 nm allows it to be incorporated at a significant level in the masking film 12 to permit tailoring of the optical properties of the mask 10 which is not possible at longer lithographic wavelengths. Additionally, the higher extinction coefficient of silicon for wavelengths above 160 nm (from a value near 1.6 to a value near 3.0 at 300 nm), allows for the control of longer wavelength transmission in the masking film 12 to be sufficiently low to allow for mask inspection and mask alignment.

Figure 1B:
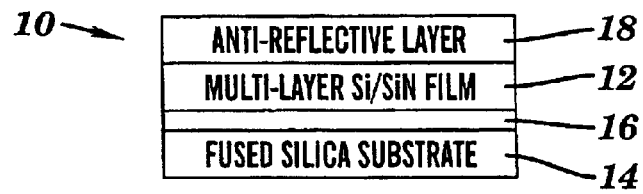
FIG. 1B is a cross-sectional diagram of a 157 nm attenuated phase shift mask in accordance with another embodiment of the present invention.
Figure 1C:
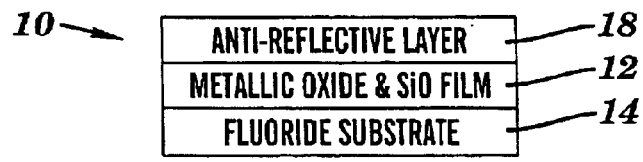
FIG. 1C is a cross-sectional diagram of a 157 nm attenuated phase shift mask in accordance with yet another embodiment of the present invention.
Figure 1D:
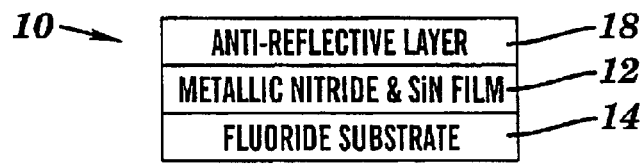
FIG. 1D is a cross-sectional diagram of a 157 nm attenuated phase shift mask in accordance with yet another embodiment of the present invention.
Figure 1E:
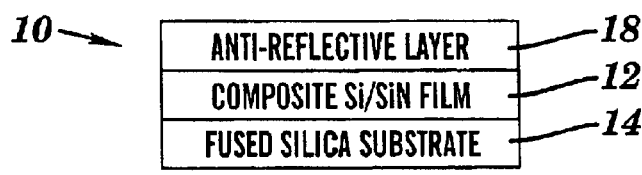
FIG. 1E is a cross-sectional diagram of a 157 nm attenuated phase shift mask in accordance with yet another embodiment of the present invention.
Figure 2:
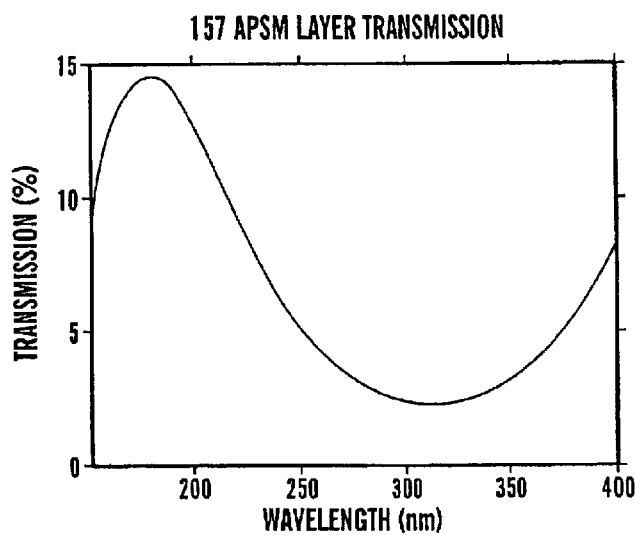
FIG. 2 is a graph illustrating the transmission of a 157 nm APSM mask in accordance with another embodiment of the present invention.

A variety of different materials with a silicon component can be used for the masking film 12. By way of example only, the masking film 12 may be made of silicon and silicon dioxide as shown in FIG. 1A, silicon and silicon nitride as shown in FIGS. 1B and 1E, a metallic oxide and silicon dioxide as shown in FIG. 1C, or a metallic nitride and silicon nitride as shown in FIG. 1D, although other combinations can also be used, such as silicon dioxide and silicon nitride, metallic oxide and silicon nitride, and metallic nitride and silicon dioxide. Additionally, by using additional materials, such as a metallic oxide or a metallic nitride, the desired short and long wavelength transmission properties of the mask 10 as well as its thermomechanical and exposing radiation stability properties can be customized. More specifically, absorbing metal oxides, such as an oxide of Ta, Mo, Ti, Fe, Ru, Mn, Cu, Cr, Ni, V, Nb, Hf, Sn, In, Co, Zr, Al, or group IV, V, VI transition metals, can be combined with silicon dioxide or silicon nitride to decrease transmission properties of the APSM film below 160 nm and at longer wavelengths. Similarly, absorbing metal nitrides, such as a nitride of Ta, Mo, Ti, Fe, Ru, Mn, Cu, Cr, Ni, V, Nb, Hf, Sn, In, Co, Zr, Al, or group IV, V, VI transition metals, can also be combined with silicon nitride or silicon dioxide to decrease transmission properties of the APSM film below 160 nm and at longer wavelengths. By varying the types of and ratios of these constituent materials for the masking film 12, control of the refractive index and extinction coefficient values allowed by and the resulting optical properties of the mask 10 can be achieved.

The particular thickness of the masking film 12 is selected to produce a phase shift of about 180°. The thickness of the masking film 12 depends upon the material or materials used to make the masking film 12 and the particular wavelength of the target radiation. Typically, the masking film 12 at a targeted wavelength at or below about 160 nm will have a thickness between about 200 Å and 2000 Å to produce the desired phase shift of about 180°.

Additionally, the masking film 12 may be comprised of a single or monolayer as shown in FIGS. 1A, 1C, 1D, or 1E or multiple layers as shown in FIG. 1B.

The masking film 12 is located on one surface of a substrate 14. A variety of different types of substrates 14 can be used, including silicon dioxide (fused silica) and various fluorides such as calcium fluoride, barium fluoride, or magnesium fluoride. as Additionally, the substrate 14 can be made with at least one material with a fluoride component, the substrate 14 can be coated with a fluoride material, or an etch allows sufficient control of masking film 12 removal without etching the substrate 14. By way of example only, as shown in FIGS. 1A, 1C, 1D, and 1E the substrate 14 may be a fluoride substrate 14, such as magnesium fluoride, calcium fluoride, lithium fluoride, or barium fluoride, although any type of fluoride optical materials sufficiently transparent below 160 nm with mechanical, chemical, and physical properties to allow for application as a substrate 14 can be used. Alternatively, as shown in FIG. 1B the substrate 14 could be a material, such as fused silica with a suitably low absorbance, with a coating 16 with a fluoride component, such as MgF$_2$, between the masking film 12 and the fused silica substrate 14 which the fluoride coating 16 acts as an etch stop layer to allow for the required etch selectivity. Further, as shown in FIG. 1E, the substrate 14 could be made of fused silica without a fluoride film coating if the etching process can be controlled to stop once the masking film 12 is etched.

One of the advantages of one embodiment of the invention is that by using a masking film 12 made with at least one material with at least silicon component on a substrate 14 made of at least one material with at least a fluoride component or a substrate 14 with a fluoride coating 16 between the masking film 12 and the substrate 14 the necessary selectivity between the masking film 12 and the substrate 14 for etching is produced. Preferably, the selectivity between the masking film 12 and substrate 14 with this combination is about 2:1 or better. This particular combination works because materials with silicon are volatile in fluorine based plasma etch chemistry, while materials with fluorine are stable in the same chemistry because these fluoride materials are in stable form (boiling points are above 2000° C.). As a result, with the present invention the masking film 12 can be etched without a significant loss of the underlying substrate 14.

Figure 3:
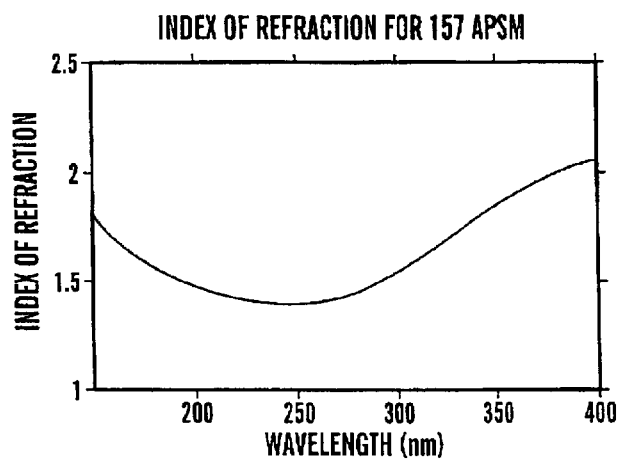
FIG. 3 is a graph illustrating the index of refraction for the mask shown in FIG. 2 from 150 nm to 400 nm.
Figure 4:
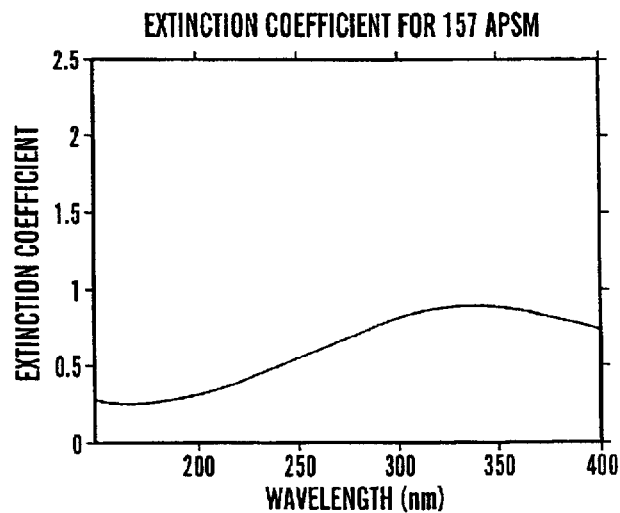
FIG. 4 is a graph illustrating the extinction coefficient for the mask shown in FIG. 2 from 150 nm to 400 nm.

An optional anti-reflective layer 18 may be located or coated on the surface of the masking film 12 opposing one surface of the substrate 14. Preferably, the material or materials used to form the anti-reflective layer 18 are adjusted to produce minimum reflectivity through quarter wave interference. More specifically, the anti-reflective layer 18 is coated to a thickness of $\lambda/4n$ (where n is the complex refractive index and this thickness allows for destructive interference of reflective effects). In this particular embodiment, the anti-reflective layer 18 is made of a silicon based dielectric, such as silicon nitride or silicon dioxide. As a result, etching of the masking film 12 along with the anti-reflective layer 18 can be carried out in fluorine based plasma with significant selectivity to the substrate 14 as discussed earlier. Set forth below with reference to FIGS. 2–13 are some examples of masks 10 which provide a transmission above 0.5% and a phase shift of about a 180° for radiation at a wavelength of about 157 nm in accordance with different embodiments of the present invention Referring to FIG. 2, the optical transmission for a silicon+ silicon nitride mask 10 deposited with ratios of 32% silicon and 68% silicon nitride on a calcium fluoride substrate is shown. In this particular example, the targeted 157 nm transmission is 10% and the graph shows the decreasing transmission to less than 5% above 250 nm. Referring to FIGS. 3 and 4, the optical constants for this mask 10 are shown. In this particular example, the masking film 12 has a thickness of about 1016 Å to achieve a 180° phase shift at 157 nm. The particular masking film 12 thicknesses are chosen corresponding to the condition $2(n-1)t=\frac{1}{2}$ or an odd multiple thereof.

Figure 5:
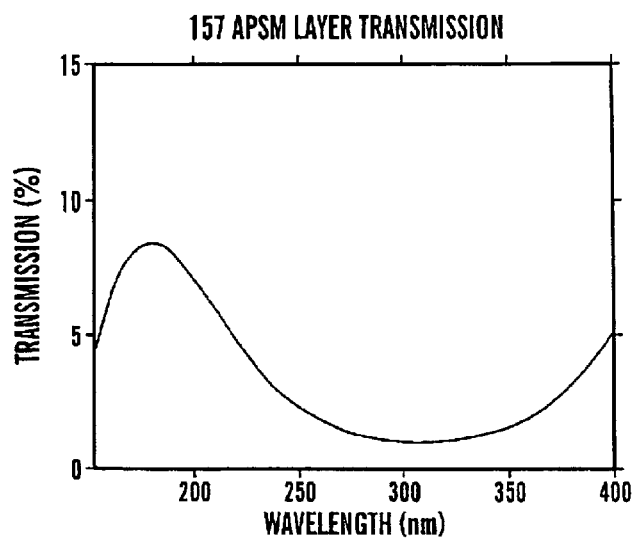
FIG. 5 is a graph illustrating the transmission of a 157 nm APSM mask in accordance with another embodiment of the present invention.
Figure 6:
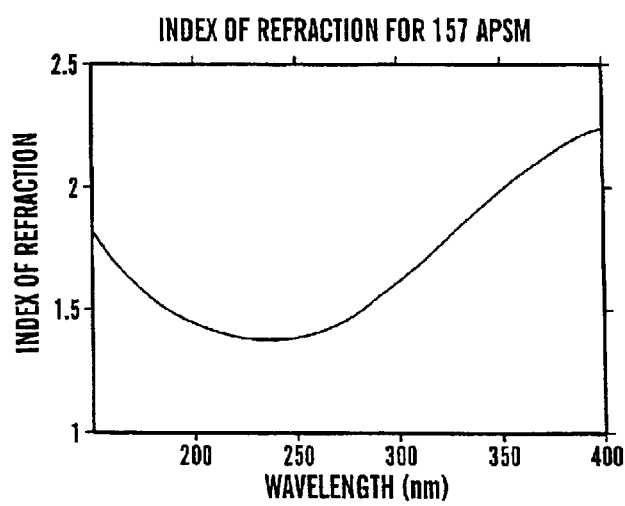
FIG. 6 is a graph illustrating the index of refraction for the mask shown in FIG. 5 from 150 nm to 400 nm.
Figure 7:
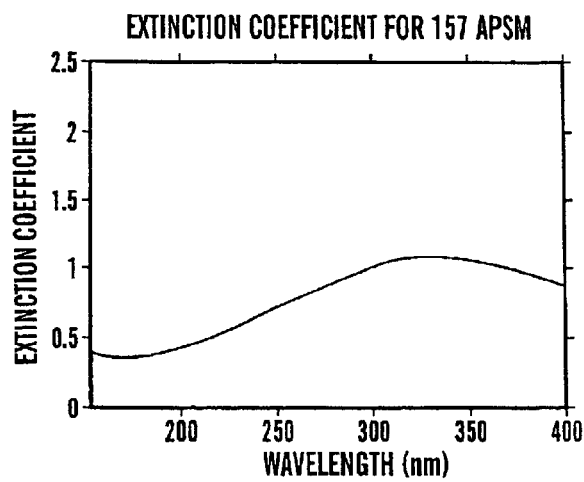
FIG. 7 is a graph illustrating the extinction coefficient for the mask shown in FIG. 5 from 150 nm to 400 nm.

Referring to FIG. 5, the optical transmission for a sputtered silicon/silicon dioxide mask 10 deposited with ratios of 38% silicon and 62% silicon dioxide on a calcium fluoride substrate is shown. In this particular example, the targeted 157 nm transmission is 5% and the graph shows the decreasing transmission to less than 3% above 250 nm. Referring to FIGS. 6 and 7, the optical constants for this particular mask 10 are shown. In this particular example, the masking film 12 has a thickness of about 1002 Å to produce a 180° phase shift at 157 nm.

Figure 8:
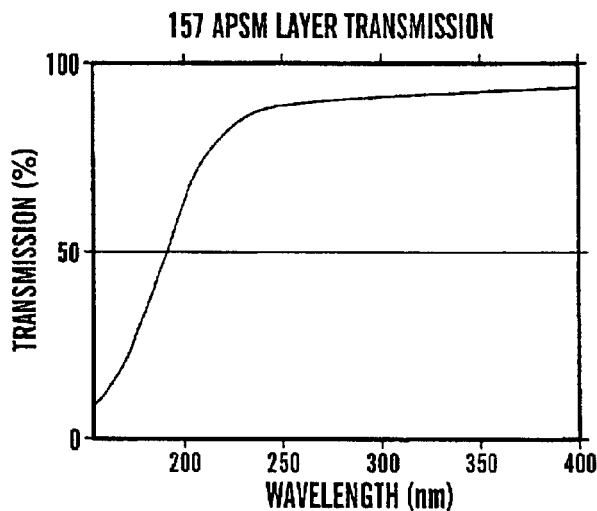
FIG. 8 is a graph illustrating the transmission of a 157 nm APSM mask in accordance with another embodiment of the present invention.
Figure 9:
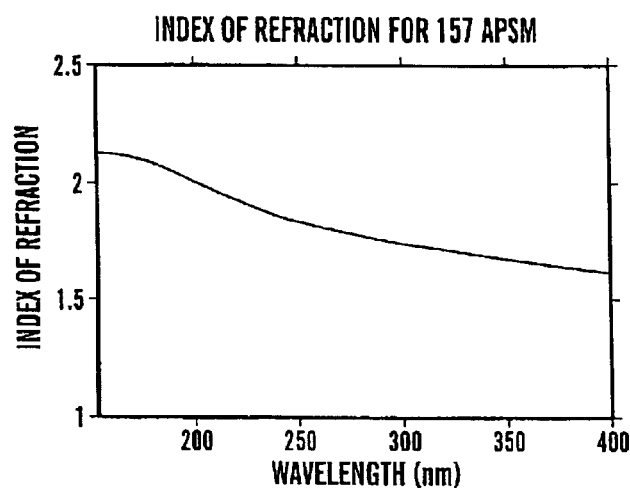
FIG. 9 is a graph illustrating the index of refraction for the mask shown in FIG. 8 from 150 nm to 400 nm.
Figure 10:
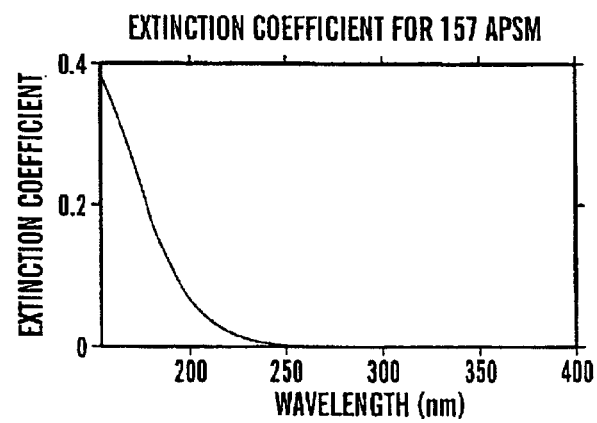
FIG. 10 is a graph illustrating the extinction coefficient for the mask shown in FIG. 8 from 150 nm to 400 nm.

Referring to FIG. 8, the optical transmission for sputtered silicon nitride/silicon dioxide mask 10 deposited with ratios of 49% silicon nitride and 51% silicon dioxide on a calcium fluoride substrate is shown. In this particular example, the targeted 157 nm transmission is 10%. Referring to FIGS. 9 and 10, the optical constants for this particular mask 10 are shown. In this particular example, this masking film 12 has a thickness of about 709 Å to produce a 180° phase shift at 157 nm.

Figure 11:
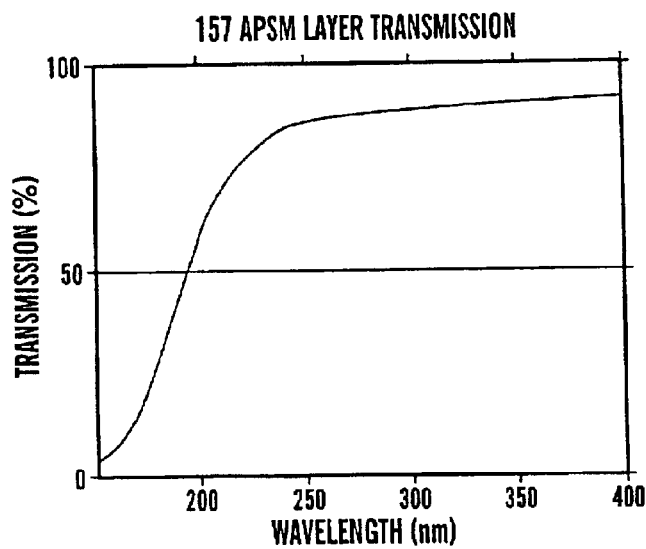
FIG. 11 is a graph of the transmission of a 157 nm APSM mask in accordance with another embodiment of the present invention.
Figure 12:
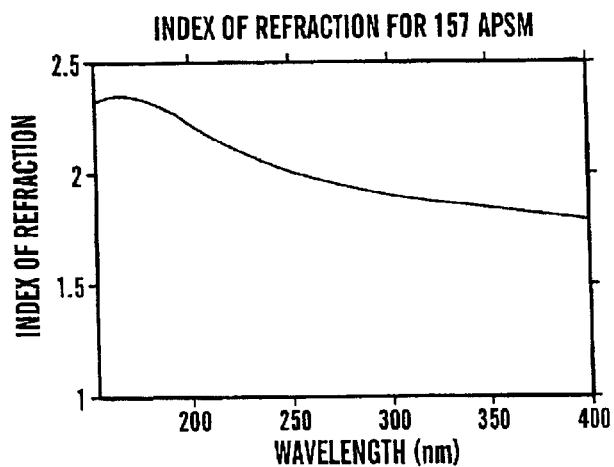
FIG. 12 is a graph illustrating the index of refraction for the film mask shown in FIG. 11 from 150 nm to 400 nm.
Figure 13:
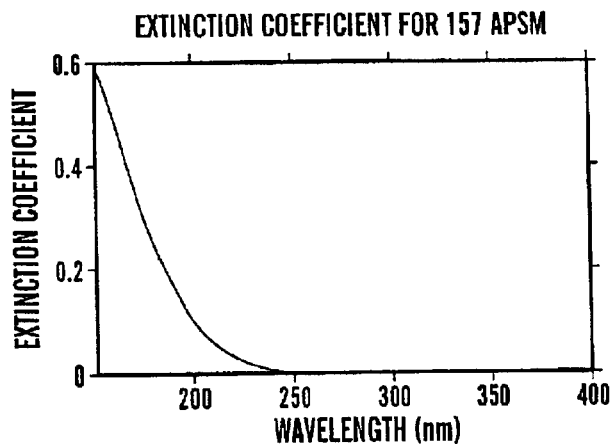
FIG. 13 is a graph illustrating the extinction coefficient for the mask shown in FIG. 11 from 150 nm to 400 nm.

Referring to FIG. 11, the optical transmission for a sputtered silicon nitride/silicon dioxide mask 10 deposited with ratios of 70% silicon nitride and 29% silicon dioxide on a calcium fluoride substrate is shown. In this particular example, the targeted 157 nm transmission is 5% and the graph shows the increasing transmission to about 80% above 250 nm. Referring to FIGS. 12 and 13, the optical constants for this particular mask 10 are shown. In this particular example, this masking film 12 has a thickness of about 601 Å to produce a 180° phase shift at 157 nm.

The optical properties and thicknesses of masking films 12 discussed in the examples above were determined using various methods including spectroscopic ellipsometry at wavelengths above 180 nm, VUV spectrophotometry (reflectance and transmission measurements) from 110 nm to 200 nm, and profilometry thickness measurements. Refractive index and extinction coefficient values were fitted from these measurements to cover the 150 to 400 nm range. Effective media approximation (EMA) modeling allowed for prediction and iteration to appropriate solutions.

Figure 14:
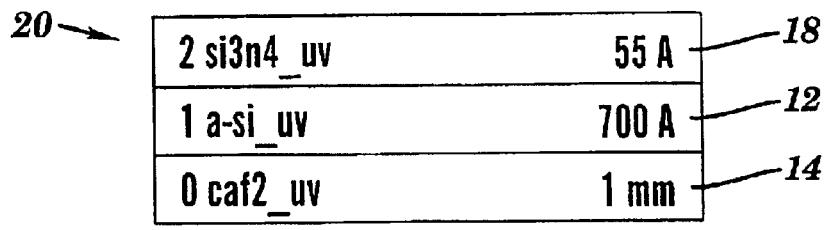
FIG. 14 is a cross-sectional diagram of a 157 nm mask in accordance with another embodiment of the present invention.

Referring to FIG. 14, another embodiment of the present invention is shown for use in applications where the needed transmission is below about 0.5% and phase shifting is not required. In this particular embodiment, this mask 20 comprises a masking film 12 made of silicon alone and having a thickness near 700 Å with a silicon nitride anti-reflective layer 18 having a thickness near 55 Å thick on a calcium fluoride substrate 14. Although silicon alone is shown for use as the mask, other materials, such as $W_1$, $Nb_1$, Ti, Ta, Nb, which can reduce the transmission below 0.5% can also be used. Additionally, although a calcium fluoride substrate 14 is shown, any type of fluoride optical materials sufficiently transparent below 160 nm with mechanical, chemical, and physical properties to allow for application as a substrate 14 for the mask 20, such as magnesium fluoride, lithium fluoride, barium fluoride, or fused silica, can be used. Further, although silicon nitride is used for the masking film 12, any silicon based dielectric, such as silicon dioxide, can be used so that etching of the masking film 12 can still be carried out in fluorine based plasma with significant selectivity to the substrate 14.

Figure 15:
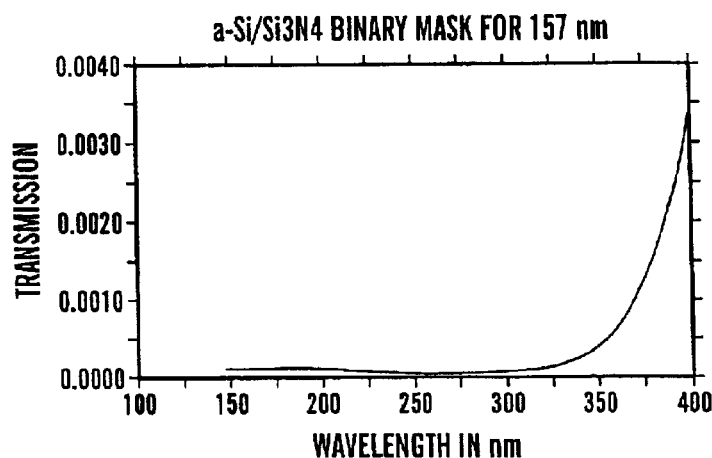
FIG. 15 is a graph illustrating the transmission properties from 150 to 400 nm for the binary 157 nm mask shown in FIG. 13.
Figure 16:
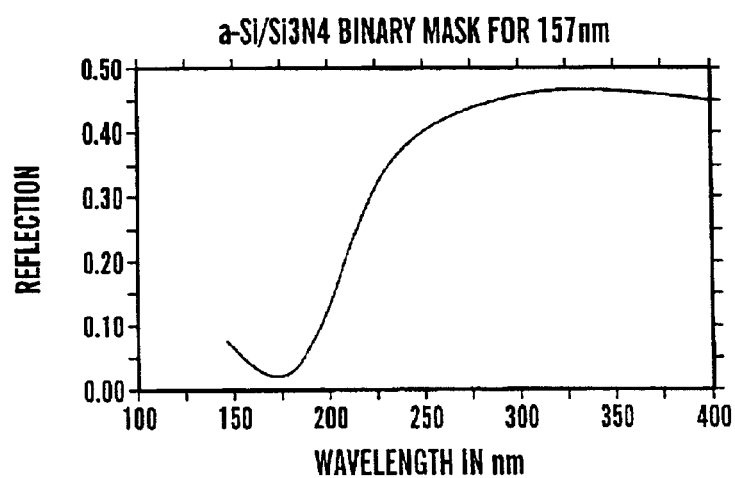
FIG. 16 is a graph illustrating the reflection of the 157 nm binary mask shown in FIG. 13 from 150 nm to 400 nm.

Referring to FIGS. 15 and 16, the transmission and reflection properties of the mask 20 shown in FIG. 14 from about 150 nm to 400 nm are shown. As shown in FIG. 15, the transmission for this mask 20 at 157 nm is below 0.5%. As shown in FIG. 16, the reflection for this mask 20 at 157 nm is below 3% and can be controlled by adjusting the thickness of the silicon nitride layer.

Etching properties of various materials with silicon as a component were determined in various fluorine chemistries. By way of example only, plasma etching can be used to etch the masks 10 and 20. In this example, plasma etching is carried out in a modified Plasma Therm RIE system utilizing a single wafer parallel plate chamber. The lower electrode is 15.2 cm in diameter and was not cooled during operation. The electrode was modified for uniform etching of calcium fluoride samples. Etch rates in this example were determined using profilometry. Etch gases studied included $SF_6$ and $CF_4$. The results of these etching examples are shown in Table 1 below and demonstrate the desirable etch selectivity of the masks 10 and 20 with respect to the substrates 14 as described above in accordance with different embodiments of the present invention. In each of these particular examples, power was held at 200 W, pressure was 200 mTorr, and gas flow was 30 sccm. As illustrated by these results, the etch selectivity of the masking film 12 to the substrate is effectively infinite.

| Etch gas | Silicon etch rate | Si3N4 etch rate | SiO2 etch rate | CaF2 etch rate |
|---|---|---|---|---|
| $SF_6$ | 50 Å/min | 500 Å/min | 200 Å/min | 0 Å/min |
| $CF_4$ | 75 Å/min | 2200 Å/min | 650 Å/min | 0 Å/min |

Although one etching technique is disclosed, other etching techniques can be used as needed or desired.

A lithographic process using a mask 10 or 20 in accordance with one embodiment of the present invention will be discussed with reference to FIGS. 1A, 1D, and 14. First, masking film 12 is placed over the one surface of the substrate 14. Again, the masking film 12 comprises at least one material with a silicon component, such as a composite of silicon, silicon oxide or dioxide, and silicon nitride either co-deposited to produce a true homogeneous film or deposited at thickness so that the resulting multi-layer film stack produces the required optical performance. Additionally, absorbing metal oxides and/or metallic nitrides, such as oxides and/or nitrides of Ta, Mo, Ti, Fe, Ru, Mn, Cu, Cr, Ni, V, Nb, Hf, Sn, In, Co, Zr, Al, or group IV, V, VI transition metals, could be combined with silicon dioxide being deposited to form the masking film 12 to decrease transmission properties of the APSM film below 160 nm and at longer wavelengths. Similarly, absorbing metal nitrides and/or metallic oxides, such as oxides and/or nitrides of Ta, Mo, Ti, Fe, Ru, Mn, Cu, Cr, Ni, V, Nb, Hf, Sn, In, Co, Zr, Al, or group IV, V, VI transition metals, could be combined with silicon nitride being deposited to form masking film 12 to decrease transmission properties of the APSM film below 160 nm and at longer wavelengths. To produce one of these masking films 12 on the substrate 14, deposition conditions are chosen so that deposition rates produce desired ratios, dwell times produce desired ratios, or deposition target density produces desired ratios.

In these particular examples, the masks 10 and 20 were produced by reactive rf magnetron sputtering of silicon, silicon dioxide, and/or silicon nitride from 8" silicon targets onto 0.5×1.0" calcium fluoride substrates and 1"×1" fused silica substrates. Masking films 12 were sputtered at power levels between 500W and 1500W with an evacuated pressure of ~1×10$^{-7}$ Torr. Prior to sputtering, substrates 14 were cleaned and dehydrated to reduce reactivity with oxygen. Masking films 12 were deposited without additional substrate heating. Composite film formation is made possible through control of partial pressure of argon, nitrogen, and/or oxygen or by depositing thicknesses of each constituent and alternating at the appropriate thickness ratio. Masking films 12 can also be deposited by direct sputtering from silicon, silicon dioxide, and/or silicon nitride targets and by passing substrates 14 under or over each target for a required amount of time. Although one technique for depositing the masking films 12 on the substrate 14 is disclosed, other techniques can be used as needed or desired.

Next, an optional anti-reflective layer 18 may be added over the masking film 12. Again, the material or materials used to form the anti-reflective layer 18 are adjusted to produce minimum reflectivity through quarter wave interference. Typically, the anti-reflective layer 18 is added to reduce the reflectivity to be preferably below about 15%, although the desired percentage of reflectivity can vary as needed or desired.

Next, the masking film 12 and the optional anti-reflective layer 18, if used, are etched to form the desired pattern. A variety of different techniques can be used to etch the masking film 12 and the anti-reflective layer 18, such as using halogen chemistries, which are well known to those of ordinary skill in the art and thus will not be described here. Again, since the anti-reflective layer 18 is made of a silicon based dielectric and the masking film 12 is made of at least one material with a silicon component, etching of the masking film 12 along with the anti-reflective layer 18 can be carried out in fluorine based plasma with significant selectivity to the substrate 14 as discussed earlier.

Once the masking film 12 the anti-reflective layer 18 have been etched into the desired pattern, the masking film 12, and the anti-reflective layer 18 are exposed to radiation at a wavelength at or below about 160 nm for use in a lithography process.

Optical properties of various metals and dielectrics have been evaluated based on deposited film data and the modeling to understand the suitability of thin films for application as 157 nm ASPM materials. The optical properties of these materials (n&k) have been determined. By adjusting material stoichiometry through control of deposition parameters (target composition ratios, pressure, power, flow rates, etc.), films can be tailored for specific optical properties. Furthermore, through co-sputtering or through the formation of graded films, a wider selection of candidates are possible. Through use of extinction coefficient/refractive index relationships for 1800 phase shift, 0.5–60 percent transmission, and <15% reflectivity, evaluation of films is possible. Ideally, a material combination should be able to be utilized for a variety of transmission values through control of deposition conditions. In addition to optical parameters, other material properties need to be evaluated prior to selection. These include, for instance, volatility of halide compounds for plasma etch patterning radiation stability, and material toxicity.

The attenuated phase shift masks and materials of the present invention provide a phase shift of 180°, a transmission from about 0.5 to about 60 percent, and are for use at a wavelength at or below about 160 nm. The materials are comprised of thin films of the semiconductors, metals, oxides, and nitrides of the families of materials, such as tantalum, titanium, zirconium, molybdenum, tungsten, niobium, aluminum, chromium, silicon, and group IV, V, and VI transitional metals.

The unique low absorption of silicon dioxide at wavelengths at or below 160 nm make it an attractive host material for use in an attenuated phase shifting layer. Silicon dioxide can be combined with either oxides of materials, such as tantalum, titanium, zirconium, molybdenum, tungsten, niobium, aluminum, chromium, and group IV, V, and VI transitional metals or nitrides of materials, such as tantalum, titanium, zirconium, molybdenum, tungsten, niobium, aluminum, chromium, silicon, and group IV, V, and VI transitional metals to achieve the desired attenuated phase shift masking optical properties. The optical properties of materials selected from these families are shown for example in the table below for a wavelength of 157 nm.

TABLE

Optical data for of thin film metals, oxides, and nitrides at 157 nm.

| Material | n | k |
|---|---|---|
| Mo | 0.711 | 1.460 |
| Nb2O5 | 0.918 | 0.748 |
| Ti | 1.055 | 1.077 |
| Ta | 1.108 | 1.349 |
| CrN | 1.129 | 0.778 |
| MoO3 | 1.155 | 1.357 |
| MoN | 1.200 | 1.500 |
| Cr2O3 | 1.416 | 0.836 |
| TiN | 1.439 | 1.449 |
| ZrN | 1.440 | 0.832 |
| TiO2 | 1.501 | 1.282 |
| TaN | 1.531 | 0.968 |
| Ta2O5 | 1.549 | 1.513 |
| SiO2 | 1.684 | 0.052 |
| NbN | 1.704 | 1.022 |
| Si3N4 | 1.758 | 0.902 |
| ZrN | 1.820 | 1.520 |
| Al2O3N | 2.050 | 0.238 |
| Al2O3R | 2.106 | 0.124 |

Figure 17:
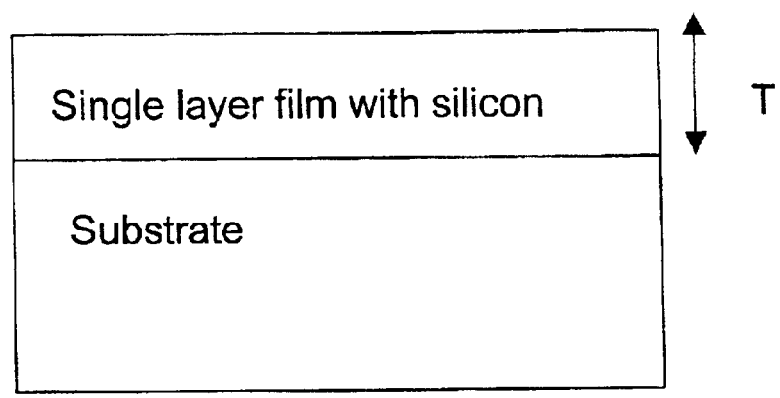
FIG. 17 is a cross sectional diagram of a single layer attenuated phase shift mask in accordance with another embodiment of the present invention.
Figure 18:
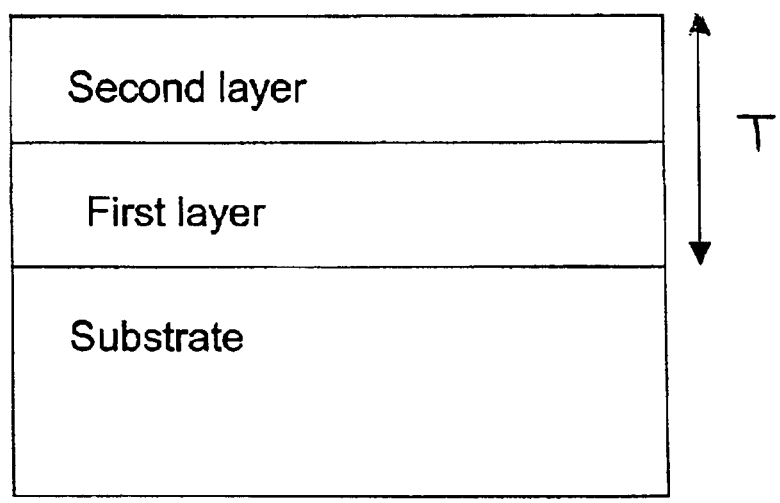
FIG. 18 is a cross sectional diagram of a multiple layer attenuated phase shift mask in accordance with another embodiment of the invention.

The attenuated phase shift masks for use at or below 160 nm in accordance of one embodiment of the present invention comprises a single layer. The single layer is a material with at least one component that is silicon. Examples include silicon dioxide (silicon oxide) with metals, oxides, and nitrides of the families of materials, such as silicon, tantalum, titanium, zirconium, molybdenum, tungsten, niobium, aluminum, chromium, and group IV, V, and VI transitional metals, as shown in FIG. 17. The thickness (T) is such that a 180° phase shift is produced with the desired transmission properties. The substrate may or may not contain a fluoride etch stop layer. Additionally, the mask in accordance with a second embodiment is shown in FIG. 18. The mask may include a stacked multilayer of a first layer disposed on a substrate and a second layer disposed on the first. The first layer comes from materials that are the metals, oxides, and nitrides of the families of materials, such as silicon, tantalum, titanium, zirconium, molybdenum, tungsten, niobium, aluminum, chromium, and group IV, V, and VI transitional metals and the second is silicon, silicon dioxide, or silicon nitride or the first layer is silicon, silicon dioxide, or silicon nitride and the second layer is from materials that are the metals, oxides, and nitrides of the families of materials, such as silicon, tantalum, titanium, zirconium, molybdenum, tungsten, niobium, aluminum, chromium, and group IV, V, and VI transitional metals.

Figure 19:
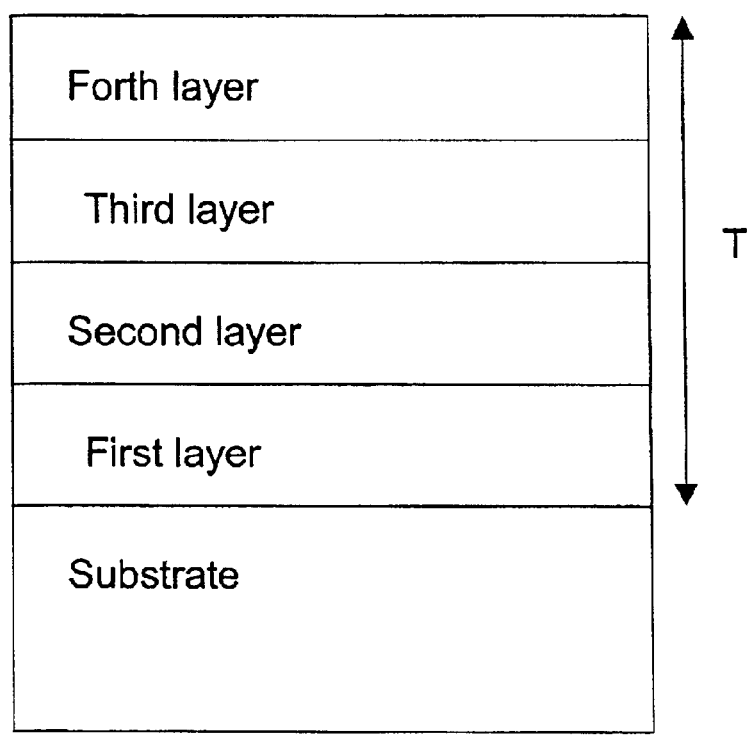
FIG. 19 is a cross sectional diagram of another multiple layer attenuated phase shift mask in accordance with another embodiment of the invention.

A mask in accordance with another embodiment is shown in FIG. 19. The first and second layers of the mask are the same as described above for the mask shown in FIG. 18. This mask also includes a third layer disposed on the second and a fourth layer disposed on the third. In the same alternating fashion as the first and second layers described above, the third and fourth layers and any further layers are made in the same way, i.e. the materials used for the third layer are selected from the same materials available for the first layer and the materials used for the fourth layer are selected from the same materials available for the second layer. Additional layer or layers may be disposed on the forth layer of the groups of the layer second adjacent to them. The total thickness (T) is such that a 180° phase shift is produced with the desired transmission properties. The layer thicknesses are chosen such that 180° phase shift is produced with the desired transmission properties within the entire film stack. The substrate may or may not contain a fluoride etch stop layer.

Figure 20:
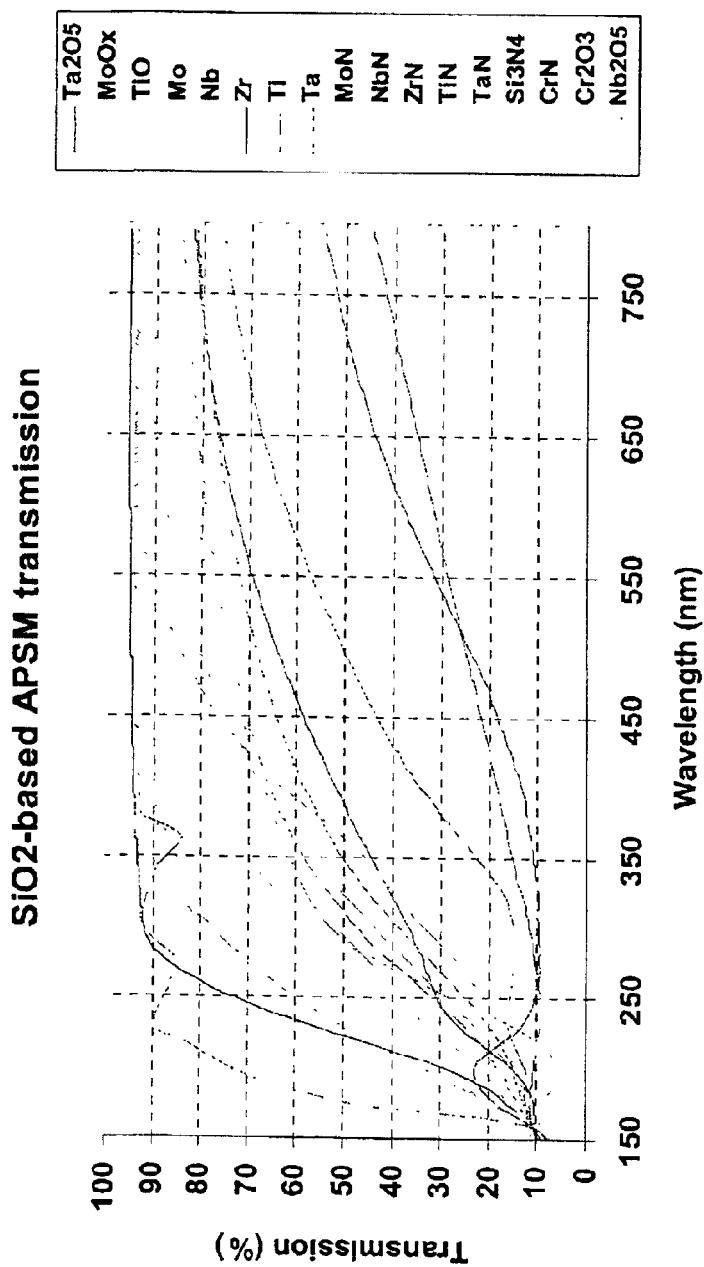
FIG. 20 is a graph illustrating transmission plots of SiO2 based 157 nm APSM materials combined with various metals, oxide, and nitrides for 10% transmission at 157 nm.

Attenuated phase shift masking films have been designed for use at 157 nm based on the constituent thin film materials that are the metals, oxides, and nitrides of the families of materials, such as silicon, tantalum, titanium, zirconium, molybdenum, tungsten, niobium, aluminum, chromium, and group IV, V, and VI transitional metals and are shown in summary in FIG. 20. These composite films are based on the materials listed in the table of optical data for of thin film metals, oxides, and nitrides at 157 nm combined with silicon dioxide as a host materials. For each case, 10% transmission and a 180° phase shift has been targeted and the transmission of the films is shown from 150 nm to 750 nm. In each case, the optical properties are modeled based on measured data from thin films deposited onto fused 1"×1" silica substrates in an rf sputtering PVD tool. Specifically, a Perkin Elmer 2400 reactive diode rf sputtering system was used and multiple 8" metal targets, corresponding to the base materials, were reacted with oxygen, nitrogen, and/or argon to obtain the appropriate deposition chemistry. Two modes of layer deposition were carried out, although others could be used. In one mode, two metal sputter targets were powered and the substrates were carried via rotation under the targets to produce a mode of mixture approaching a single homogeneous film. In the second mode of layer deposition, one metal target was powered at a time, allowing for the deposition of a layered structure comprising two layers, three layers, four layers, or more to achieve the composition ratios required for the attenuated phase shift masking optical properties. Spectroscopic ellipsometry was used via a Woollam VUV WVASE system to measure ellipsometric behavior which lead to the extraction of optical properties from 140 nm to 800 nm (and as shown in the table of optical data for of thin film metals, oxides, and nitrides at 157 nm). A McPherson VUV spectrophotometer was utilized for transmission measurement and for optical performance to 130 nm. Thickness measurement was carried out using profilometry (AlphaStep) and atomic force microscopy (Digital Systems). Measurement and re-deposition iterations were carried out with the aid of effective media theory (EMT) modeling to achieve the desired characteristics. Additionally, chemical compositional analysis was carried out using a Physical Electronics 5700 Sci for X-ray photoelectron spectroscopy (XPS).

Figure 21:
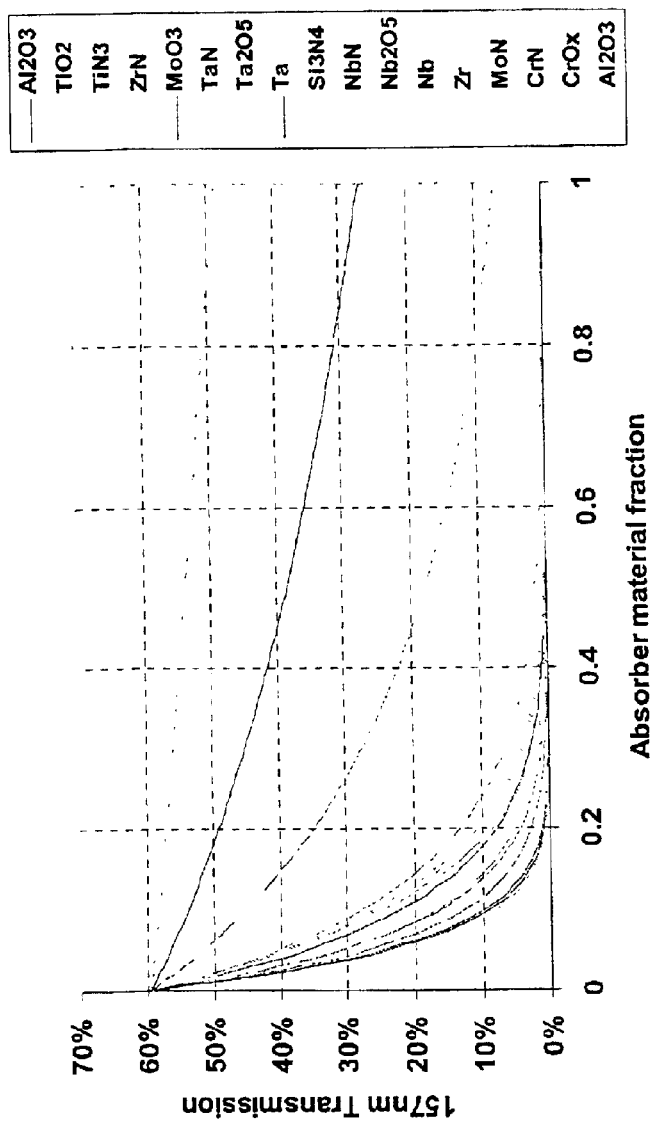
FIG. 21 is a graph illustrating percentage of transmission at 157 nm vs. absorber material fraction to show the tunability of composites through control of material ratios.
Figure 22:
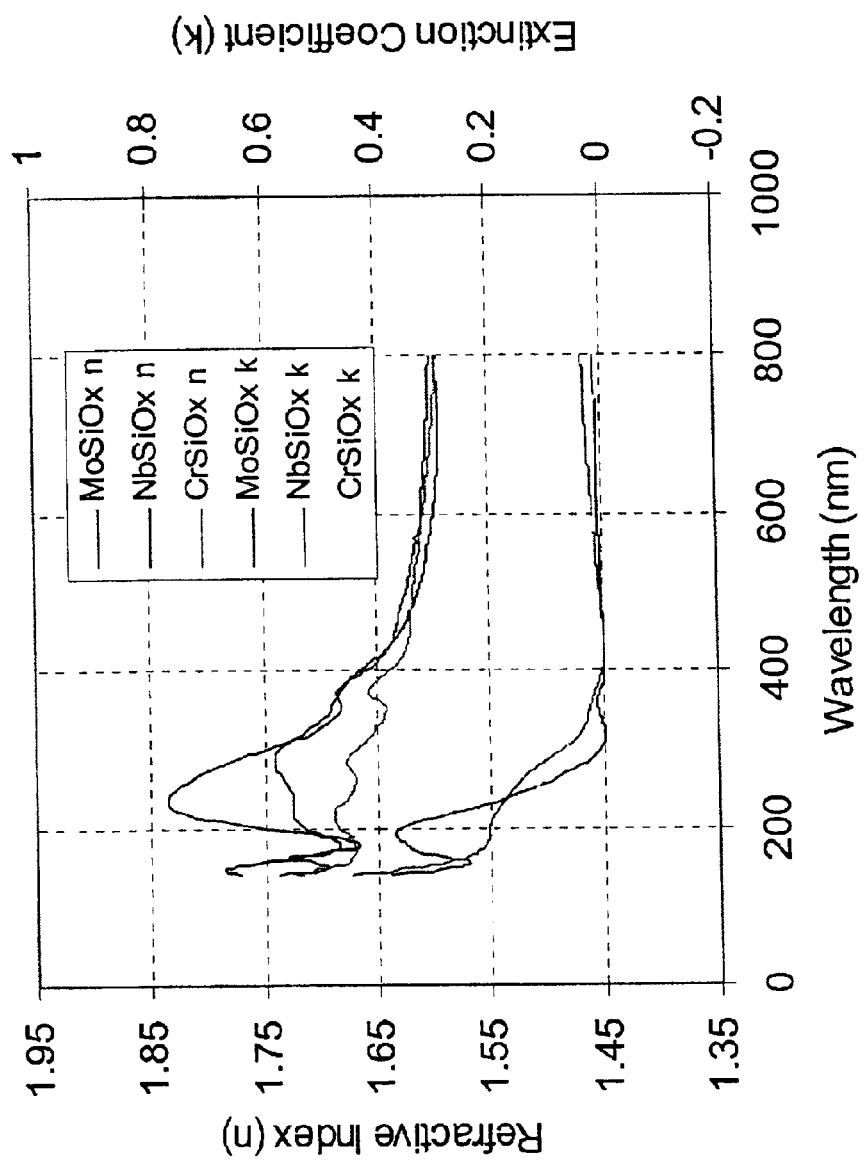
FIG. 22 is a graph illustrating a refractive index v. wavelength for several composite APSM materials.

By tailoring the fractional weighting of the constituents within the masking film, the candidate APSM films are tunable across the desired transmission range. This is carried out through the control of the power to the individual targets during dual deposition and single layer deposition or through the layer properties during the multilayer deposition. Additionally, process conditions including pressure, gas flow, and substrate properties impact the properties of the layer or layers. The upper bound of transmission is determined by the silicon dioxide host, which is theoretically 100% based on physical properties but is practically limited by absorption of a deposited film. Our present value for this upper limit is near 60% but this could be increased to 80% with modification of deposition methods. FIG. 21 is a plot of 157 nm transmission vs. absorber material fraction, indicating the tunability of composites through control of material ratios. As an example of the resulting optical properties of the composite attenuated phase shift masking materials, detailed refractive index and extinction coefficient data for three of the candidates composites (NbO/SiO, CrO/SiO, and MoO/SiO) are shown in FIG. 22.

The challenge in etching APSM films is to etch the deposited material without significant loss of the underlying fused silica. The 157 nm APSM performance specifications require etch selectivity to substrate of at least 2:1. The usefulness of a material will ultimately be determined by the ability to plasma pattern transfer through the film. Experiments are being performed in a modified Plasma Therm RIE system utilizing a single wafer parallel plate chamber. The lower electrode is modified to allow for uniform etching of small fused silica samples. The lower electrode is 15.2 cm in diameter and was not cooled during operation. The chamber is not load locked and was pumped down typically below 10–5 torr before processing.

The volatility of oxifluorides is beneficial for the absorber/silicon dioxide candidates that are under evaluation. It should be noted, however, that at the concentration levels of the absorbers that are under consideration, the physical etch reactions in RIE processes can be sufficient in the absence of volatile chemical byproducts. One etch chemistry for absorber/silicon dioxide is fluorine based. Chemical etching would not proceed into a $MgF_2$ or LiF etch stop layers in the proposed APSM configuration. As an example, a summary of etch characteristics for a $Nb_2O_5$/$SiO_2$ composite APSM film is given in another table below. The etch selectivity of these films suggests that a fluoride based etch stop layer is required.

SF6+O2 Process CF4+O2 Process
SF6 50 sccm/$O_2$ 5 sccm CF4 50 sccm/$)_2$ 2.5 sccm
40 mT, 100 W 40 mT, 100W
NbSi—O [SiO2/Nb2O5 etch rate 750 Å/minNbSi—O [SiO2/Nb2O5] etch rate 120Å/min
Selectivity to a-SiO2 1.4:1:1 Selectivity to a-SiO2 1.2:1:1
Selectivity to resist (DNQ/Novolac) 0.6:1 Selectivity to resist (DNQ/Novolac) 0.6:1
Selectivity to $MgF_2$ etch stop>100:1 Selectivity to $MgF_2$ etch stop>100:1

Adhesion of APSM Films

Adhesion of attenuating films to a fused silica mask substrate is a critical requirement for mask application. Magnetron sputtering technology provides for better adhesion than techniques such as simple evaporation. This is accomplished because of plasma bombardment, which removes loose contamination and creates nucleation sites. Additionally, to ensure maximum adhesion and reduce the need for additional sputter cleaning, oxygen-active metals such as molybdenum, aluminum and zirconium etc. have been favored for investigation.

The interfacial aspects of deposited films contribute to adhesive properties. Several nondestructive methods are available to test for adhesive bonding, including ultrasonic, radiographic, optical holographic, and acoustic. The method chosen for this work was a destructive peel test method to assess bond strength.

The ASTM test methods B 905, known as the Mechanized Tape Tests, have been used to evaluate the adhesion of APSM film candidates. In these methods, which are destructive, the measurement area used is a broken coating surface created by scoring a lattice pattern through the coating to the substrate and peeling at angles of 90 and 180°, respectively. Adhesion is assessed qualitatively on the 0 to 5 scale. The ASTM B 905 procedures have been followed, except where noted. The tape material used was 2.3 mil 3 M Scotch Transparent Film Tape 600 with 40 oz/in width adhesion strength, 28 lb/in width transverse tensile strength.

At a peel angle of 90°, and a rate of peel of 20–25 mm/sec, all films passed the ASTM adhesion test with a score of five with no detachment of the squares of the lattice. The mask should have a score of at least three on the ASTM adhesion test.

Optimized films have been tested for chemical durability in a hydrogen peroxide/sulfuric acid bath at 90° C. for 2 hours. Such chemistry is currently used to clean chromium based photomasks. Specific chemical composition for testing was 1:10 hydrogen peroxide: sulfuric acid. Film thickness was used to measure effects on films. Film thickness was measured prior to subjecting to treatment and after two hours. A film change of less than 5% was considered within metrology limits. As an example, the $Nb_2O_5$/$SiO_2$ APSM film experienced insignificant loss (<5%) after this test procedure. All films possessed similar durability characteristics. The mask should change no more than five percent.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. Additionally, the recited order of processing elements or sequences, or the use of numbers, letters, or other designations therefor, is not intended to limit the claimed processes to any order except as may be specified in the claims. These alterations, improvements, and modifications are intended to be suggested hereby, and are within the spirit and scope of the invention.

What is claimed is:

1. A mask for use in a lithography process, the mask comprising a masking film made of at least one material with at least a silicon component which provides a transmission above about 0.5 percent up to about 60 percent and a phase shift of about a 180° for radiation at a wavelength at or below about 160 nm, wherein the material comprises silicon dioxide and silicon nitride.

2. The mask as set forth in claim 1 wherein the masking film comprises a single layer.

3. The mask as set forth in claim 1 wherein the masking film comprises multiple layers.

4. The mask as set forth in claim 1 wherein the masking film allows for transmission up to about 90% at wavelengths up to about 400 nm.

5. The mask as set forth in claim 1 wherein the masking film has a thickness ranging between about 200 and 2000 Å in thickness.

6. The mask as set forth in claim 1 further comprising a substrate made with at least one material with a fluoride component, the masking film located on at least a portion of the substrate.

7. The mask as set forth in claim 1 further comprising a substrate which comprises fused silica with a fluoride film overcoat, the masking film located on at least a portion of the substrate.

8. The mask as set forth in claim 1 wherein the selectivity between the masking film and an underlying substrate is above 2:1.

9. The mask as set forth in claim 1 wherein the masking film has an adhesion of at least three.

10. The mask as set forth in claim 1 wherein less than five percent of the mask film is changed when the masking film is subjected to a hydrogen peroxide/sulfuric acid bath at 90° C. for about two hours.

11. The mask as set forth in claim 1 further comprising an anti-reflective layer located on the masking film.

12. The mask as set forth in claim 11 wherein the anti-reflective layer comprises a silicon based dielectric material coated to a quarter wave thickness to reduce reflectivity below 15%.

13. A mask for use in a lithography process, the mask comprising a masking film made of at least one material with at least a silicon component which provides a transmission above about 0.5 percent up to about 60 percent and a phase shift of about a 180° for radiation at a wavelength at or below about 160 nm, wherein the material is made of at least one metallic oxide or metallic oxinitride with silicon dioxide.

14. The mask as set forth in claim 13 wherein the metallic oxide is selected from a group consisting of oxides of Ta, Hf, Sn, Mo, Ti, Fe, Ru, W, Mn, Cu, Cr, Ni, V, Nb, In, Co, Al, Zr, and group IV, V, and VI transition metals.

15. The mask as set forth in claim 13 wherein the masking film comprises a single layer.

16. The mask as set forth in claim 13 wherein the masking film comprises multiple layers.

17. The mask as set forth in claim 13 wherein the masking film allows for transmission up to about 90% at wavelengths up to about 400 nm.

18. The mask as set forth in claim 13 wherein the masking film has a thickness ranging between about 200 and 2000 Å in thickness.

19. The mask as set forth in claim 13 further comprising a substrate made with at least one material with a fluoride component, the masking film located on at least a portion of the substrate.

20. The mask as set forth in claim 13 further comprising a substrate which comprises fused silica with a fluoride film overcoat, the masking film located on at least a portion of the substrate.

21. The mask as set forth in claim 13 wherein the selectivity between the masking film and an underlying substrate is above 2:1.

22. The mask as set forth in claim 13 wherein the masking film has an adhesion of at least three.

23. The mask as set forth in claim 13 wherein less than five percent of the mask film is change when the masking film is subjected to a hydrogen peroxide/sulfuric acid bath at 90° C. for about two hours.

24. The mask as set forth in claim 13 further comprising an anti-reflective layer located on the masking film.

25. The mask as set forth in claim 24 wherein the anti-reflective layer comprises a silicon based dielectric material coated to a quarter wave thickness to reduce reflectivity below 10%.

26. A mask for use in a lithography process, the mask comprising a masking film made of at least one material with at least a silicon component which provides a transmission above about 0.5 percent and a phase shift of about a 180° for radiation at a wavelength at or below about 160 nm wherein the material is made of at least one metallic nitride or metallic oxinitride with silicon nitride.

27. The mask as set forth in claim 26 wherein the metallic nitride is selected from a group consisting of nitrides of Ta, Hf, Sn, Mo, Ti, Fe, Ru, W, Mn, Cu, Cr, Ni, V, Nb, In, Co, Al, Zr, and group IV, V, and VI transition metals.

28. The mask as set forth in claim 26 wherein the masking film comprises a single layer.

29. The mask as set forth in claim 26 wherein the masking film comprises multiple layers.

30. The mask as set forth in claim 26 wherein the masking film allows for transmission up to about 90% at wavelengths up to about 400 nm.

31. The mask as set forth in claim 26 wherein the masking film has a thickness ranging between about 200 and 2000 Å in thickness.

32. The mask as set forth in claim 26 further comprising a substrate made with at least one material with a fluoride component, the masking film located on at least a portion of the substrate.

33. The mask as set forth in claim 26 further comprising a substrate which comprises fused silica with a fluoride film overcoat, the masking film located on at least a portion of the substrate.

34. The mask as set forth in claim 26 wherein the selectivity between the masking film and an underlying substrate is above 2:1.

35. The mask as set forth in claim 26 wherein the masking film has an adhesion of at least three.

36. The mask as set forth in claim 26 wherein less than five percent of the mask film is changed when the masking film is subjected to a hydrogen peroxide/sulfuric acid bath at 90° C. for about two hours.

37. The mask as set forth in claim 26 further comprising an anti-reflective layer located on the masking film.

38. The mask as set forth in claim 37 wherein the anti-reflective layer comprises a silicon based dielectric material coated to a quarter wave thickness to reduce reflectivity below 15%.

39. A mask for use in a lithography process, the mask comprising a masking film made of at least one material with at least a silicon component which provides a transmission above about 0.5 percent up to about 40 percent and a phase shift of about a 180° for radiation at a wavelength at or below about 160 nm, wherein the material is made of at least one metallic nitride or metallic oxinitride with silicon dioxide.

40. The mask as set forth in claim 39 wherein the metallic nitride is selected from a group consisting of nitrides of Ta, Hf, Sn, Mo, Ti, Fe, Ru, W, Mn, Cu, Cr, Ni, V, Nb, In, Co, Al, Zr, Si, and group IV, V, and VI transition metals.

41. The mask as set forth in claim 39 wherein the masking film comprises a single layer.

42. The mask as set forth in claim 39 wherein the masking film comprises multiple layers.

43. The mask as set forth in claim 39 wherein the masking film allows for transmission up to about 90% at wavelengths up to about 400 nm.

44. The mask as set forth in claim 39 wherein the masking film has a thickness ranging between about 200 and 2000 Å in thickness.

45. The mask as set forth in claim 39 further comprising a substrate made with at least one material with a fluoride component, the masking film located on at least a portion of the substrate.

46. The mask as set forth in claim 39 further comprising a substrate which comprises fused silica with a fluoride film overcoat, the masking film located on at least a portion of the substrate.

47. The mask as set forth in claim 39 wherein the selectivity between the masking film and an underlying substrate is above 2:1.

48. The mask as set forth in claim 39 wherein the masking film has an adhesion of at least three.

49. The mask as set forth in claim 39 wherein less than five percent of the mask film is changed when the masking film is subjected to a hydrogen peroxide/sulfuric acid bath at 90° C. for about two hours.

50. The mask as set forth in claim 39 further comprising an anti-reflective layer located on the masking film.

51. The mask as set forth in claim 50 wherein the anti-reflective layer comprises a silicon based dielectric material coated to a quarter wave thickness to reduce reflectivity below 15%.

52. A mask for use in a lithography process, the mask comprising a masking film made of at least one material with at least a silicon component which provides a transmission above about 0.5 percent and a phase shift of about a 180° for radiation at a wavelength at or below about 160 nm wherein the material is made of at least one metallic oxide or metallic oxinitride with silicon nitride.

53. The mask as set forth in claim 52 wherein the metallic oxide is selected from a group consisting of oxides of Ta, Hf, Sn, Mo, Ti, Fe, Ru, W, Mn, Cu, Cr, Ni, V, Nb, In, Co, Al, Zr, Si, and group IV, V, and VI transition metals.

54. The mask as set forth in claim 52 wherein the masking film comprises a single layer.

55. The mask as set forth in claim 52 wherein the masking film comprises multiple layers.

56. The mask as set forth in claim 52 wherein the masking film allows for transmission up to about 90% at wavelengths up to about 400 nm.

57. The mask as set forth in claim 52 wherein the masking film has a thickness ranging between about 200 and 2000 Å in thickness.

58. The mask as set forth in claim 52 further comprising a substrate made with at least one material with a fluoride component, the masking film located on at least a portion of the substrate.

59. The mask as set forth in claim 52 further comprising a substrate which comprises fused silica with a fluoride film overcoat, the masking film located on at least a portion of the substrate.

60. The mask as set forth in claim 52 wherein the selectivity between the masking film and an underlying substrate is above 2:1.

61. The mask as set forth in claim 52 wherein the masking film has an adhesion of at least three.

62. The mask as set forth in claim 52 wherein less than five percent of the mask film is changed when the masking film is subjected to a hydrogen peroxide/sulfuric acid bath at 90° C. for about two hours.

63. The mask as set forth in claim 52 further comprising an anti-reflective layer located on the masking film.

64. The mask as set forth in claim 63 wherein the anti-reflective layer comprises a silicon based dielectric material coated to a quarter wave thickness to reduce reflectivity below 15%.

65. An attenuated phase shift mask for use in lithography comprising:
a substrate; and
a masking film which provides a transmission above about 0.5 percent and a phase shift of about a 180° for radiation at a wavelength at or below about 160 nm and comprises a first layer disposed on the substrate and a second layer disposed on the first layer, wherein the first layer is a metal oxide, a metal nitride, or a metal oxinitride selected from a group consisting of oxides and nitrides of Ta, Hf, Sn, Mo, Ti, Fe, Ru, W, Mn, Cu, Cr, Ni, V, Nb, In, Co, Al, Zr, Si, and group IV, V, and VI transition metals and the second layer is silicon dioxide or silicon nitride $Si_xN_y$ or the first layer is silicon dioxide or silicon nitride $Si_xN_y$ and the second layer is a metal oxide,metal nitride, or metal oxinitride selected from a group consisting of oxides and nitrides of Ta, Hf, Sn, Mo, Ti, Fe, Ru, W, Mn, Cu, Cr, Ni, V, Nb, In, Co, Al, Zr, Si, and group IV, V, and VI transition metals.

66. The mask as set forth in claim 65 further comprising a third layer disposed on the second layer, the third layer is silicon dioxide or silicon nitride $Si_xN_y$ if the second layer is a metal oxide,metal nitride, or metal oxinitride selected from a group consisting of oxides and nitrides of Ta, Hf, Sn, Mo, Ti, Fe, Ru, W, Mn, Cu, Cr, Ni, V, Nb, In, Co, Al, Zr, Si and group IV, V, and VI transition metals and is a metal oxide, metal nitride, or metal oxinitride selected from a group consisting of oxides and nitrides of Ta, Hf, Sn, Mo, Ti, Fe, Ru, W, Mn, Cu, Cr, Ni, V, Nb, In, Co, Al, Zr, Si, and group IV, V, and VI transition metals if the second layer is silicon dioxide or silicon nitride $Si_xN_y$.

67. The mask as set forth in claim 66 further comprising a fourth layer disposed on the third layer, the fourth layer is silicon dioxide or silicon nitride $Si_xN_y$ if the third layer is a metal oxide,metal nitride, or metal oxinitride selected from a group consisting of oxides and nitrides of Ta, Hf, Sn, Mo, Ti, Fe, Ru, W, Mn, Cu, Cr, Ni, V, Nb, In, Co, Al, Zr, Si, and group IV, V, and VI transition metals and is a metal oxide, metal nitride, or metal oxinitride selected from a group consisting of oxides and nitrides of Ta, Hf, Sn, Mo, Ti, Fe, Ru, W, Mn, Cu, Cr, Ni, V, Nb, In, Co, Al, Zr, Si, and group IV, V, and VI transition metals if the third layer is silicon dioxide or silicon nitride $Si_xN_y$.

* * * * *